US009881962B2

(12) United States Patent
Otani et al.

(10) Patent No.: US 9,881,962 B2
(45) Date of Patent: Jan. 30, 2018

(54) SEMICONDUCTOR APPARATUS, SOLID STATE IMAGING DEVICE, IMAGING APPARATUS AND ELECTRONIC EQUIPMENT, AND MANUFACTURING METHOD THEREOF

(71) Applicant: SONY CORPORATION, Tokyo (JP)

(72) Inventors: Hidetsugu Otani, Kumamoto (JP); Yuuji Kishigami, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/035,839

(22) PCT Filed: Nov. 27, 2014

(86) PCT No.: PCT/JP2014/081331
§ 371 (c)(1),
(2) Date: May 11, 2016

(87) PCT Pub. No.: WO2015/087705
PCT Pub. Date: Jun. 18, 2015

(65) Prior Publication Data
US 2016/0293653 A1  Oct. 6, 2016

(30) Foreign Application Priority Data
Dec. 10, 2013  (JP) .................................. 2013-254730

(51) Int. Cl.
*H01L 27/14* (2006.01)
*H01L 27/146* (2006.01)
(Continued)

(52) U.S. Cl.
CPC ........ *H01L 27/14643* (2013.01); *H01L 24/03* (2013.01); *H01L 24/05* (2013.01);
(Continued)

(58) Field of Classification Search
None
See application file for complete search history.

(56) References Cited

U.S. PATENT DOCUMENTS 5,670,797 A * 9/1997 Okazaki .................. H01L 24/97
257/100
6,403,895 B1 * 6/2002 Sota .................. H01L 23/49816
174/260

(Continued)

FOREIGN PATENT DOCUMENTS

JP  6-113214 A  4/1994
JP  2004-88082 A  3/2004

(Continued)

OTHER PUBLICATIONS

International Search Report received for PCT Application No. PCT/JP2014/081331, dated Mar. 3, 2015, 2 pages.

(Continued)

*Primary Examiner* — Michael Lebentritt
(74) *Attorney, Agent, or Firm* — Chip Law Group

(57) ABSTRACT

The present technology relates to a semiconductor apparatus, a solid state imaging device, an imaging apparatus and electronic equipment which realize a smaller and thinner size and which enable improvement of optical characteristics, and a manufacturing method thereof. A side electrode 16c is formed on a side face of a substrate on which an imaging device 16 is formed. By this side electrode 16c being connected to an electrode pad 15b on the substrate 15 through a chip wiring 17 formed with solder, the imaging device 16 is electrically connected to the substrate 15. By this means, because it is possible to electrically connect the imaging device 16 to the substrate 15 without using wire bonding, space required for wire bonding is not required, so that it is possible to realize a smaller and thinner apparatus.

(Continued)

The present technology can be applied to an imaging apparatus.

10 Claims, 4 Drawing Sheets

(51) Int. Cl.
*H04N 5/225* (2006.01)
*H01L 23/00* (2006.01)

(52) U.S. Cl.
CPC ............. *H01L 24/13* (2013.01); *H01L 24/16* (2013.01); *H01L 27/14618* (2013.01); *H01L 27/14636* (2013.01); *H01L 27/14683* (2013.01); *H01L 27/14689* (2013.01); *H04N 5/2253* (2013.01); *H04N 5/2254* (2013.01); *H01L 2224/02371* (2013.01); *H01L 2224/0346* (2013.01); *H01L 2224/03602* (2013.01); *H01L 2224/0401* (2013.01); *H01L 2224/05573* (2013.01); *H01L 2224/05644* (2013.01); *H01L 2224/05647* (2013.01); *H01L 2224/05655* (2013.01); *H01L 2224/05664* (2013.01); *H01L 2224/06182* (2013.01); *H01L 2224/131* (2013.01); *H01L 2224/16057* (2013.01); *H01L 2224/16105* (2013.01); *H01L 2224/16227* (2013.01); *H01L 2224/94* (2013.01)

(56) References Cited

U.S. PATENT DOCUMENTS

| | | | | |
|---|---|---|---|---|
| 6,836,002 B2 * | 12/2004 | Chikawa | ............ | H01L 23/3121 257/666 |
| 7,064,425 B2 * | 6/2006 | Takahashi | ......... | H01L 23/49575 257/686 |
| 7,122,834 B2 * | 10/2006 | Ogihara | ..................... | B41J 2/45 257/67 |
| 7,180,099 B2 * | 2/2007 | Ogihara | ..................... | B41J 2/45 257/72 |
| 7,312,536 B2 * | 12/2007 | Yamano | ................ | H01L 21/568 257/787 |
| 7,323,778 B2 * | 1/2008 | Shizuno | .............. | H01L 23/3128 257/693 |
| 7,576,431 B2 * | 8/2009 | Takahashi | ............ | H01L 23/525 257/686 |
| 7,825,513 B2 * | 11/2010 | Osumi | ................ | H01L 23/3171 257/737 |
| 7,838,983 B2 * | 11/2010 | Ishihara | .................. | H01L 22/32 257/678 |
| 7,911,047 B2 * | 3/2011 | Hasegawa | ............. | H01L 23/043 257/678 |
| 8,482,137 B2 * | 7/2013 | Yoshioka | ................ | H01L 24/24 257/618 |
| 8,557,700 B2 * | 10/2013 | Ishihara | ............. | H01L 23/3114 257/E21.597 |
| 8,564,121 B2 * | 10/2013 | Ihara | .................... | H01L 23/552 257/675 |
| 8,575,760 B2 * | 11/2013 | Phee | ................ | H01L 21/76898 257/621 |
| 8,664,538 B2 * | 3/2014 | Kim | .................... | H01L 21/6835 174/260 |
| 8,772,084 B2 * | 7/2014 | Lee | ......................... | H01L 24/24 257/686 |
| 8,901,749 B2 * | 12/2014 | Kim | ....................... | H01L 24/49 257/686 |
| 8,987,864 B2 * | 3/2015 | Kim | ........................ | H01L 28/20 257/536 |
| 9,070,393 B2 * | 6/2015 | Yoshioka | ................ | G11B 5/486 |
| 9,455,240 B2 * | 9/2016 | Konno | .................. | H01L 24/743 |
| 2003/0026303 A1 * | 2/2003 | Ouchi | ................. | H01S 5/02272 372/36 |
| 2005/0242433 A1 * | 11/2005 | Moriya | .................. | H01L 24/05 257/736 |
| 2007/0252242 A1 * | 11/2007 | Matsumoto | ............. | H01L 22/34 257/620 |

FOREIGN PATENT DOCUMENTS

JP    2005-56999 A    3/2005
JP    2008-311280 A    12/2008

OTHER PUBLICATIONS

Written Opinion received for PCT Application No. PCT/JP2014/081331, dated Mar. 3, 2015, 4 pages.
International Preliminary Report received for PCT Application No. PCT/JP2014/081331, dated Jun. 14, 2016, 4 pages.

* cited by examiner

SEMICONDUCTOR APPARATUS, SOLID STATE IMAGING DEVICE, IMAGING APPARATUS AND ELECTRONIC EQUIPMENT, AND MANUFACTURING METHOD THEREOF

CROSS REFERENCE TO RELATED APPLICATIONS

This application is a U.S. National Phase of International Patent Application No. PCT/JP2014/081331 filed on Nov. 27, 2014, which claims priority benefit of Japanese Patent Application No. JP 2013-254730 filed in the Japan Patent Office on Dec. 10, 2013. Each of the above-referenced applications is hereby incorporated herein by reference in its entirety.

TECHNICAL FIELD

The present technology relates to a semiconductor apparatus, a solid state imaging device, an imaging apparatus and electronic equipment, and a manufacturing method thereof, and, more particularly, to a semiconductor apparatus, a solid state imaging device, an imaging apparatus and electronic equipment which realize a smaller and thinner size and which enable improvement of optical characteristics, and a manufacturing method thereof.

BACKGROUND ART

A technique has been proposed which improves optical characteristics upon assembly of a substrate on which an imaging device typified by a charge coupled device (CCD) and a complementary metal oxide semiconductor (CMOS) is assembled, and an optical system block constituted with a lens, or the like.

For example, it is known that, when there is a mounting wiring located below a light receiving surface, infrared light is transmissive to a bottom, and the infrared light reflected at the wiring appears in an output image.

Therefore, in order to prevent the light receiving surface from being illuminated with the reflected infrared light, a technique has been proposed which disposes the mounting wiring at an outer periphery of the light receiving surface and connects an electrode pad on a chip front face and an implementation pattern on a rear face with a side wiring (see Patent Literature 1).

CITATION LIST

Patent Literature

Patent Literature 1: Patent Application No. 2007-165696

SUMMARY OF INVENTION

Technical Problem

However, in the above-described technique, while a side portion is used as a wiring, because the side portion is not used as a mount terminal, and a wiring portion is protected, there is a risk of increasing assembly process.

The present technology has been made in view of such circumstances, and is intended to realize a smaller and thinner size by providing a terminal at a substrate side portion and improve optical characteristics by removing reflected light through wire bonding.

Solution to Problem

According to one aspect of the present technology, there is provided a semiconductor apparatus including: a chip substrate including a predetermined circuit; and an electrode terminal configured to receive supply of an electrical signal or power supplied from outside or supply an electrical signal or power to be outputted to the outside. The electrode terminal is provided on a side face of the chip substrate.

The electrode pad can be further included at an end portion of both or at least one of a front face and a rear face of the chip substrate, at a position corresponding to the electrode terminal provided on the side face of the chip substrate.

According to one aspect of the present technology, there is provided a solid state imaging device including: a chip substrate including a circuit of an imaging device; and an electrode terminal configured to receive supply of an electrical signal or power supplied from outside or supply an electrical signal or power to be outputted to the outside. The electrode terminal is provided on a side face of the chip substrate.

The electrode pad can be further included at an end portion of both or at least one of a front face and a rear face of the chip substrate, at a position corresponding to the electrode terminal provided on the side face of the chip substrate.

According to one aspect of the present technology, there is provided an imaging apparatus including: a chip substrate including a circuit of an imaging device; and an electrode terminal configured to receive supply of an electrical signal or power supplied from outside or supply an electrical signal or power to be outputted to the outside. The electrode terminal is provided on a side face of the chip substrate.

The electrode pad can be further included at an end portion of both or at least one of a front face and a rear face of the chip substrate, at a position corresponding to the electrode terminal provided on the side face of the chip substrate.

According to one aspect of the present technology, there is provided electronic equipment including: a chip substrate including a circuit of an imaging device; and an electrode terminal configured to receive supply of an electrical signal or power supplied from outside or supply an electrical signal or power to be outputted to the outside. The electrode terminal is provided on a side face of the chip substrate.

The electrode pad can be further included at an end portion of both or at least one of a front face and a rear face of the chip substrate, at a position corresponding to the electrode terminal provided on the side face of the chip substrate.

According to one aspect of the present technology, there is provided a manufacturing method of a semiconductor apparatus including a chip substrate including a predetermined circuit, and an electrode terminal configured to receive supply of an electrical signal or power supplied from outside or supply an electrical signal or power to be outputted to the outside, the electrode terminal being provided on a side face of the chip substrate, the manufacturing method including: a first step of forming a through-hole on the side face of the chip substrate, at a position on the wafer on which the electrode terminal is formed; a second step of applying metal forming the electrode terminal to the through-hole; and a third step of cutting out the chip substrate by cutting the wafer along the through-hole.

According to one aspect of the present technology, there is provided a manufacturing method of a solid state imaging device including a chip substrate including a circuit of an imaging device, and an electrode terminal configured to receive supply of an electrical signal or power supplied from outside or supply an electrical signal or power to be outputted to the outside, the electrode terminal being provided on a side face of the chip substrate, the manufacturing method including: a first step of forming a through-hole on the side face of the chip substrate, at a position on the wafer on which the electrode terminal is formed; a second step of applying metal forming the electrode terminal to the through-hole; and a third step of cutting out the chip substrate by cutting the wafer along the through-hole.

According to one aspect of the present technology, there is provided a manufacturing method of an imaging apparatus including a chip substrate including a circuit of an imaging device, and an electrode terminal configured to receive supply of an electrical signal or power supplied from outside or supply an electrical signal or power to be outputted to the outside, the electrode terminal being provided on a side face of the chip substrate, the manufacturing method including: a first step of forming a through-hole on the side face of the chip substrate, at a position on the wafer on which the electrode terminal is formed; a second step of applying metal forming the electrode terminal to the through-hole; and a third step of cutting out the chip substrate by cutting the wafer along the through-hole.

According to one aspect of the present technology, there is provided a manufacturing method of electronic equipment including a chip substrate including a circuit of an imaging device, and an electrode terminal configured to receive supply of an electrical signal or power supplied from outside or supply an electrical signal or power to be outputted to the outside, the electrode terminal being provided on a side face of the chip substrate, the manufacturing method including: a first step of forming a through-hole on the side face of the chip substrate, at a position on the wafer on which the electrode terminal is formed; a second step of applying metal forming the electrode terminal to the through-hole; and a third step of cutting out the chip substrate by cutting the wafer along the through-hole.

According to one aspect of the present technology, an electrode terminal which receives supply of an electrical signal or power supplied from outside or which supplies an electrical signal or power to be outputted to the outside is provided at a side face of a chip substrate including a predetermined circuit.

Advantageous Effects of Invention

According to one aspect of the present technology, it is possible to realize a smaller and thinner size and improve optical characteristics.

DESCRIPTION OF EMBODIMENTS

An embodiment for implementing the present technology (hereinafter, referred to as an embodiment) will be described below. It should be noted that description will be provided in the following order.
1. First Embodiment (Example Where Optical System Block is Assembled on Glass Surface)
2. Modified Example (Example Where Optical System Block is Assembled on Frame)
<<1. First Embodiment>>
<Configuration Example of Imaging Apparatus>

Figure 1:
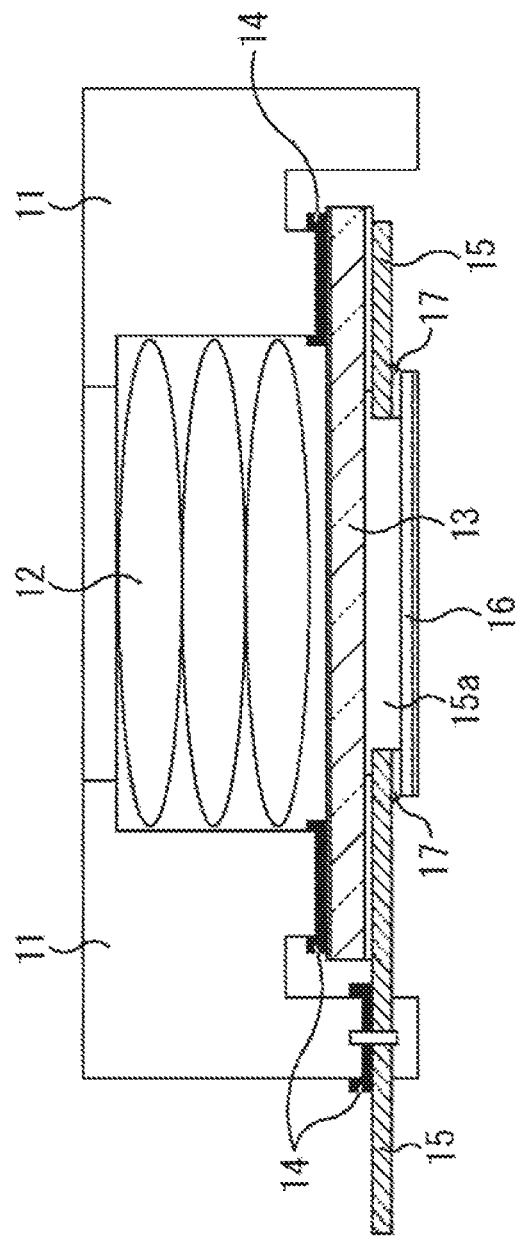
FIG. 1 is a diagram for explaining a configuration of one embodiment of an imaging apparatus to which the present technology is applied.

FIG. 1 is a block diagram illustrating a configuration example of one embodiment of an imaging apparatus to which the present technology is applied.

FIG. 1 illustrates a side face cross-sectional diagram near an imaging device and an optical system block, of the imaging apparatus, in which incident light is incident from above to below in the drawing.

In FIG. 1, an opening portion 15a is provided at a substrate 15, and an imaging device 16 is connected via a chip wiring 17 at a position corresponding to the opening portion 15a on a lower face of the substrate 15 in the drawing. Meanwhile, a glass plate 13 is provided on an upper face of the substrate 15.

Further, on the glass plate 13, a lens barrel portion 11 which includes an optical system block 12 having optical characteristics for both focusing and focus adjustment or either focusing or focus adjustment is provided, and fixed with an adhesive 14 applied on the substrate 15 and the glass plate 13.

According to a configuration as illustrated in FIG. 1, by incident light incident from above in the drawing being transmissive through the optical system block 12, the incident light is adjusted so as to be focused on the imaging device 16, transmissive through the glass pate 13 and incident on the imaging device 16. The imaging device 16, which is a solid state imaging device typified by a complementary metal-oxide semiconductor (CMOS), outputs an image signal constituted with a pixel signal generated through photoelectric conversion with the incident light incident in this manner.
<Chip Wiring Connection Imaging Device and Substrate in FIG. 1>

Figure 2:
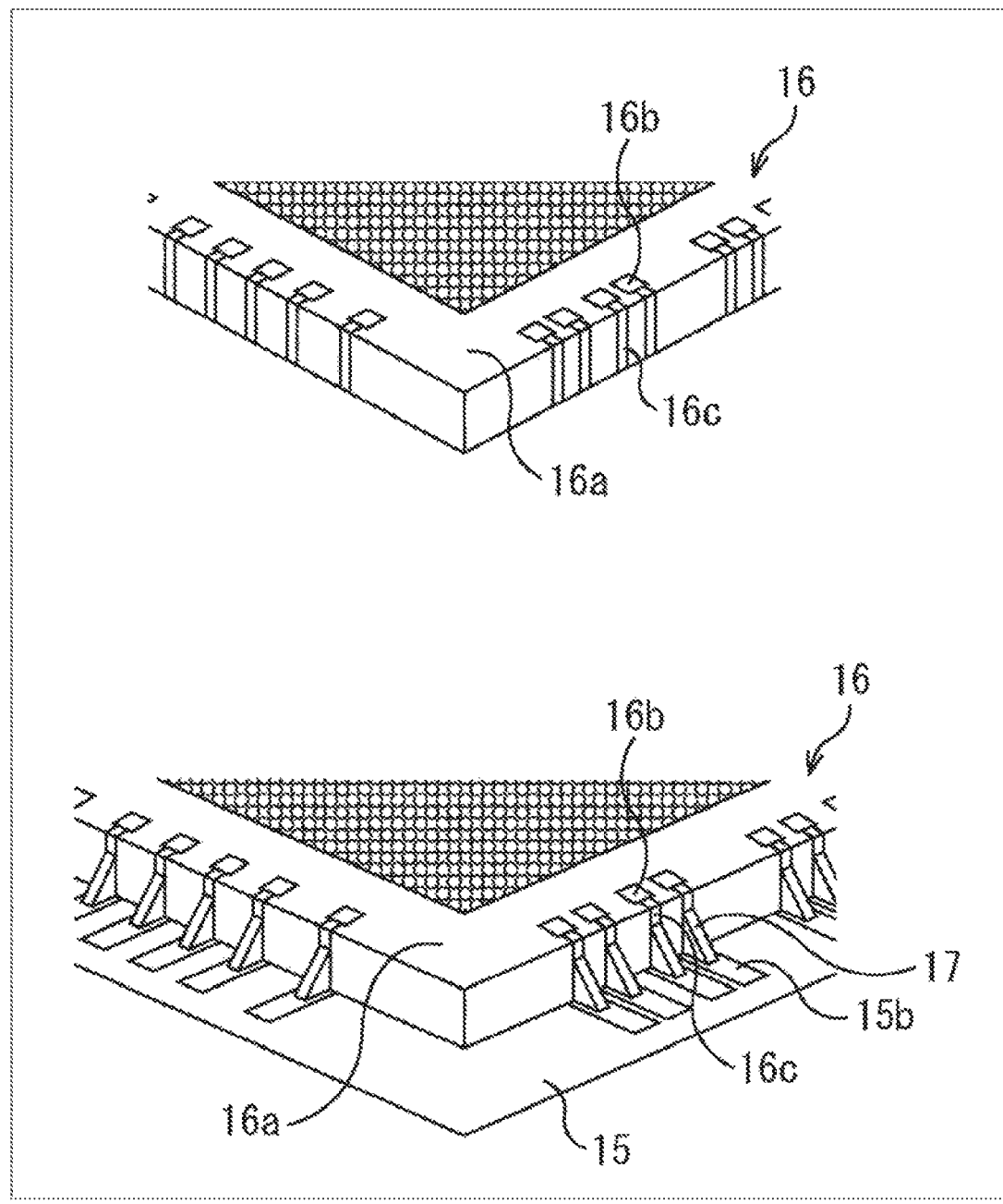
FIG. 2 is a diagram for explaining a structure of a side electrode of an imaging device in FIG. 1.

Detail of the chip wiring 17 which connects the imaging device 16 and the substrate 15 will be described next with reference to FIG. 2. FIG. 2 is an enlarged view of a portion at which the chip wiring 17 which connects the imaging device 16 and the substrate 15 is provided, an upper part of FIG. 2 illustrates a configuration of only the imaging device 16, and a lower part of FIG. 2 illustrates a state where the imaging device 16 is connected to the substrate 15.

As illustrated in the upper part of FIG. 2, in the semiconductor apparatus constituted with the imaging device 16, at an end portion of the chip substrate 16a, a side electrode 16c is provided at a side face of the chip substrate 16a forming the imaging device 16, along with an electrode pad 16b provided on a front face and a rear face (not illustrated).

According to such a configuration, as illustrated in the lower part of FIG. 2, the electrode pad 15b provided on the substrate 15 is electrically connected to the side electrode 16c by being connected through the chip wiring 17 formed with solder.

As a result, because the electrode pad 15b is not connected to the electrode pad 16b through wire bonding as in related art, space required for installing a wire is not required, which makes it possible to reduce a connection portion, it is possible to realize a thinner and smaller apparatus. Further, because the electrode pads are not connected through wire bonding, it is possible to reduce flare or ghost generated by incident light being reflected at a surface of the wire, so that it is possible to realize higher quality. Still further, concerning the semiconductor apparatus which configures the imaging device 16, because the side face portion is soldered by the chip wiring 17, even when the substrate 15 becomes thinner, it is possible to improve strength by fillet formed through soldering.

<Manufacturing Processing of Imaging Device in FIG. 1>

Figure 3:
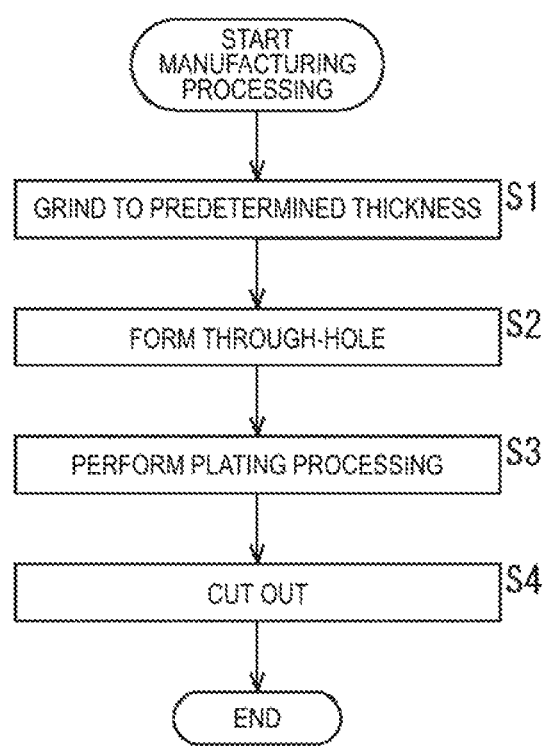
FIG. 3 is a flowchart for explaining manufacturing processing of the imaging device in FIG. 1.

Manufacturing processing of the imaging device 16 in FIG. 1 will be described next with reference to the flowchart of FIG. 3.

In step S1, a wafer formed with silicon, or the like, which forms a substrate of the imaging device 16 is ground until the wafer has a predetermined thickness. It should be noted that, at this time point, a circuit which configures a plurality of imaging devices 16 and the electrode pad 16b are formed on the wafer.

In step S2, through-holes are formed at positions at which individual side faces of the chip substrate 16a of the imaging device 16 are formed on the wafer using a through silicon via (TSV) technique.

In step S3, the through-holes are subjected metal plating processing using copper, nickel, palladium, gold, or the like.

In step S4, a boundary of the wafer is cut along the positions at which the through-holes subjected to metal plating are provided, and individual imaging devices 16 are cut out in units of the chip substrate 16a. At this time, because by the through-holes being cut along axes of the holes, the portions subjected to metal plating processing are exposed along the axes of the through-holes on the side face of the chip substrate 16a on which the cut-out imaging devices 16 are formed, and the side electrodes 16c are formed.

Because the side electrode 16c is formed through the above processing, as illustrated in FIG. 2, it is possible to electrically connect the imaging device 16 and the substrate 15 with the chip wiring 17.

As a result, because the electrode pad 15b is not connected to the electrode pad 16b through wire bonding as in related art, and space required for installing a wire is not required, it is possible to make a connection portion smaller, so that it is possible to realize a thinner and smaller apparatus. Further, because the electrode pad 15b is not connected to the electrode pad 16b through wire bonding, it is possible to reduce flare or ghost generated by incident light being reflected at the surface of the wire. Still further, concerning the semiconductor apparatus configuring the imaging device 16, because the side electrode 16c forming the side face of the chip substrate 16a is soldered by the chip wiring 17, even when the substrate 15 becomes thinner, it is possible to improve strength by fillet formed through this soldering.

Further, while, in the above description, an example of the semiconductor apparatus which functions as the imaging device 16 has been described, even with a semiconductor apparatus in which other circuits are configured on the substrate and which has other functions, it is possible to provide the same advantageous effects by configuring a side electrode on a side face of the chip using the a method similar to the method described above.

<<2. Modified Example>>

Figure 4:
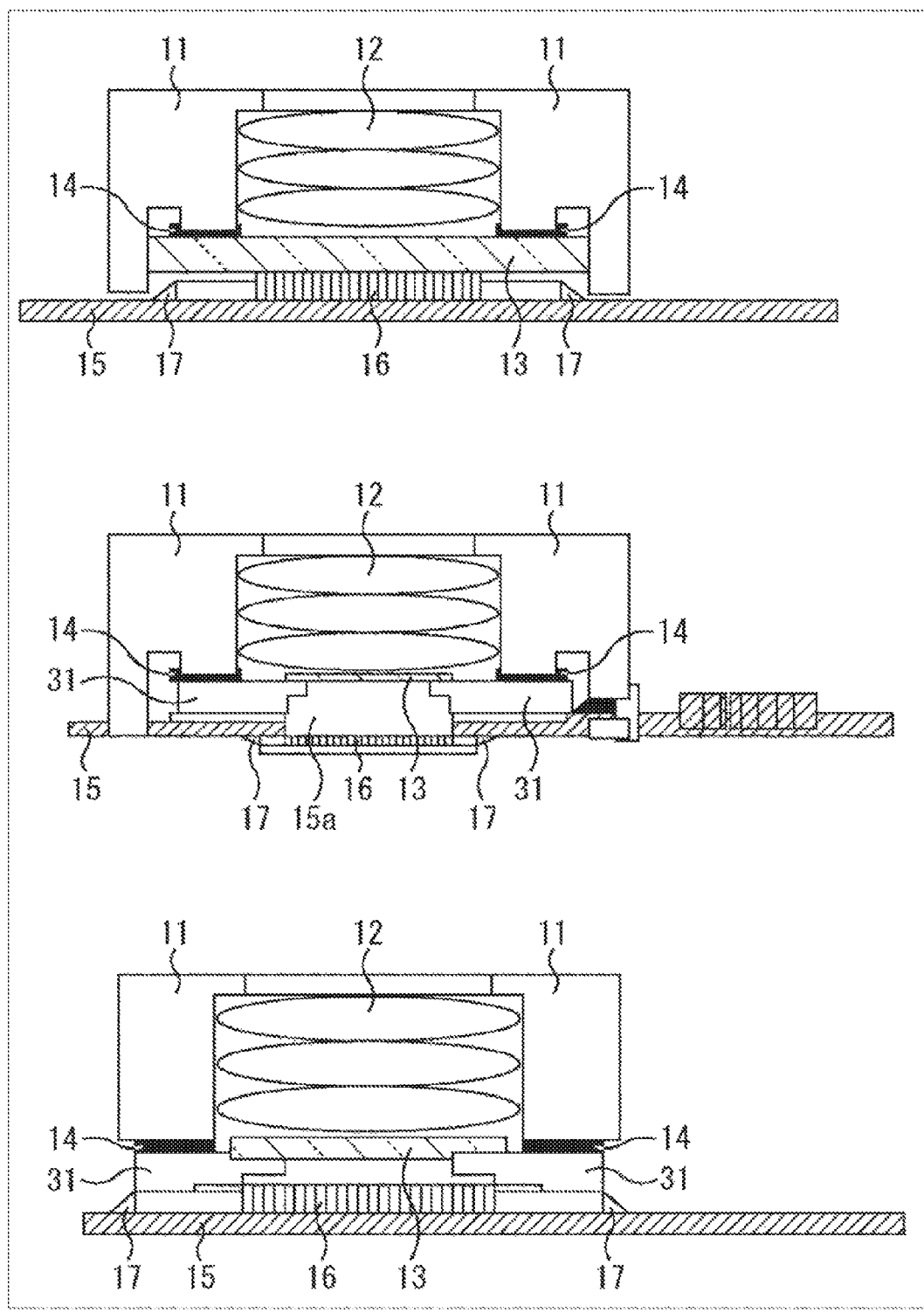
FIG. 4 is a diagram for explaining a modified example of the imaging device to which the present technology is applied.

While, in the above description, an example where the opening portion 15a is provided at the substrate 15 and the imaging device is connected to the lower portion of the substrate 15 in FIG. 1 has been described, for example, as illustrated in an upper part of FIG. 4, it is also possible to provide the imaging device 16 on the substrate 15. Also in this case, at the substrate 15, the side electrode 16c of the imaging device 16 is connected to the electrode pad 15b of the substrate 15 through the chip wiring 17.

Further, while, in the above description, an example where the lens barrel portion 11 including the optical system block 12 is mounted on the glass plate 13 has been described, the optical system block 12 may be mounted on a frame provided on the substrate 15.

That is, as illustrated in a middle part and a lower part of FIG. 4, the optical system block 12 is mounted on the frame 31 provided on the substrate 15. Also in this case, at the substrate 15, the side electrode 16c of the imaging device 16 is connected to the electrode pad 15b of the substrate 15 through the chip wiring 17. It should be noted that, in the middle part of FIG. 4, the opening portion 15a is provided at the substrate 15, and the imaging device 16 is mounted at the corresponding position at the lower portion in the drawing of the substrate 15. Further, in a lower part of FIG. 4, the opening portion 15a is not provided at the substrate 15, and the imaging device 16 is mounted at the corresponding position at the upper portion in the drawing of the substrate 15.

In either case, advantageous effects which are the same as those described above are provided.

The present technology is not limited to the above-described embodiments, but various modifications are possible insofar as they are within the scope of the present technology.

Additionally, the present technology may also be configured as below.

(1) A semiconductor apparatus including:
a chip substrate including a predetermined circuit; and
an electrode terminal configured to receive supply of an electrical signal or power supplied from outside or supply an electrical signal or power to be outputted to the outside,
wherein the electrode terminal is provided on a side face of the chip substrate.

(2) The semiconductor apparatus according to (1), further including:
the electrode pad at an end portion of both or at least one of a front face and a rear face of the chip substrate, at a position corresponding to the electrode terminal provided on the side face of the chip substrate.

(3) A solid state imaging device including:
a chip substrate including a circuit of an imaging device; and
an electrode terminal configured to receive supply of an electrical signal or power supplied from outside or supply an electrical signal or power to be outputted to the outside,
wherein the electrode terminal is provided on a side face of the chip substrate.

(4) The solid state imaging device according to (3), further including:
the electrode pad at an end portion of both or at least one of a front face and a rear face of the chip substrate, at a position corresponding to the electrode terminal provided on the side face of the chip substrate.

(5) An imaging apparatus including:
a chip substrate including a circuit of an imaging device; and an electrode terminal configured to receive supply of an electrical signal or power supplied from outside or supply an electrical signal or power to be outputted to the outside, wherein the electrode terminal is provided on a side face of the chip substrate.

(6) The imaging apparatus according to (5), further including:

the electrode pad at an end portion of both or at least one of a front face and a rear face of the chip substrate, at a position corresponding to the electrode terminal provided on the side face of the chip substrate.

(7) Electronic equipment including:

a chip substrate including a circuit of an imaging device; and an electrode terminal configured to receive supply of an electrical signal or power supplied from outside or supply an electrical signal or power to be outputted to the outside, wherein the electrode terminal is provided on a side face of the chip substrate.

(8) The electronic equipment according to (7), further including:

an electrode pad at an end portion of both or at least one of a front face and a rear face of the chip substrate, at a position corresponding to the electrode terminal provided on the side face of the chip substrate.

(9) A manufacturing method of a semiconductor apparatus including a chip substrate including a predetermined circuit, and an electrode terminal configured to receive supply of an electrical signal or power supplied from outside or supply an electrical signal or power to be outputted to the outside, the electrode terminal being provided on a side face of the chip substrate, the manufacturing method including:

a first step of forming a through-hole on the side face of the chip substrate, at a position on the wafer on which the electrode terminal is formed;

a second step of applying metal forming the electrode terminal to the through-hole; and a third step of cutting out the chip substrate by cutting the wafer along the through-hole.

(10) A manufacturing method of a solid state imaging device including a chip substrate including a circuit of an imaging device, and an electrode terminal configured to receive supply of an electrical signal or power supplied from outside or supply an electrical signal or power to be outputted to the outside, the electrode terminal being provided on a side face of the chip substrate, the manufacturing method including:

a first step of forming a through-hole on the side face of the chip substrate, at a position on the wafer on which the electrode terminal is formed;

a second step of applying metal forming the electrode terminal to the through-hole; and a third step of cutting out the chip substrate by cutting the wafer along the through-hole.

(11) A manufacturing method of an imaging apparatus including a chip substrate including a circuit of an imaging device, and an electrode terminal configured to receive supply of an electrical signal or power supplied from outside or supply an electrical signal or power to be outputted to the outside, the electrode terminal being provided on a side face of the chip substrate, the manufacturing method including:

a first step of forming a through-hole on the side face of the chip substrate, at a position on the wafer on which the electrode terminal is formed;

a second step of applying metal forming the electrode terminal to the through-hole; and a third step of cutting out the chip substrate by cutting the wafer along the through-hole.

(12) A manufacturing method of electronic equipment including a chip substrate including a circuit of an imaging device, and an electrode terminal configured to receive supply of an electrical signal or power supplied from outside or supply an electrical signal or power to be outputted to the outside, the electrode terminal being provided on a side face of the chip substrate, the manufacturing method including:

a first step of forming a through-hole on the side face of the chip substrate, at a position on the wafer on which the electrode terminal is formed;

a second step of applying metal forming the electrode terminal to the through-hole; and a third step of cutting out the chip substrate by cutting the wafer along the through-hole.

REFERENCE SIGNS LIST 11 lens barrel portion
12 optical system block
13 glass plate
14 adhesive
15 substrate
15a opening portion
15a electrode pad
16 imaging device
16a chip substrate
16b electrode pad
16c side electrode
17 chip wiring
31 frame

The invention claimed is:

1. A semiconductor apparatus, comprising:
a chip substrate including a circuit;
an electrode terminal configured to at least receive supply of one of an electrical signal or power supplied from outside or the electrode terminal is configured to supply one of an electrical signal or power to be outputted to the outside, wherein the electrode terminal is provided on a side face of the chip substrate; and
a first electrode pad provided respectively at an end portion of both a front face and a rear face of the chip substrate, wherein the first electrode pad is provided at a position corresponding to the electrode terminal on the side face of the chip substrate.

2. A solid state imaging device, comprising:
a chip substrate including a circuit of an imaging device;
an electrode terminal configured to at least receive supply of one of an electrical signal or power supplied from outside or the electrode terminal is further configured to supply one of an electrical signal or power to be outputted to the outside, wherein the electrode terminal is provided on a side face of the chip substrate; and
an electrode pad provided respectively at an end portion of both a front face and a rear face of the chip substrate, wherein the electrode pad is provided at a position corresponding to the electrode terminal on the side face of the chip substrate.

3. An imaging apparatus, comprising:
a chip substrate including a circuit of an imaging device;
an electrode terminal configured to at least receive supply of one of an electrical signal or power supplied from outside or the electrode terminal is configured to supply one of an electrical signal or power to be outputted to the outside, wherein the electrode terminal is provided on a side face of the chip substrate; and
an electrode pad provided respectively at an end portion of both a front face and a rear face of the chip substrate, wherein the electrode pad is provided at a position corresponding to the electrode terminal on the side face of the chip substrate.

4. An electronic equipment, comprising:
a chip substrate including a circuit of an imaging device;
an electrode terminal configured to at least receive supply of one of an electrical signal or power supplied from outside or the electrode terminal is configured to supply one of an electrical signal or power to be outputted to the outside, wherein the electrode terminal is provided on a side face of the chip substrate; and
an electrode pad provided respectively at an end portion of both a front face and a rear face of the chip substrate, wherein the electrode pad is provided at a position corresponding to the electrode terminal on the side face of the chip substrate.

5. A manufacturing method of a semiconductor apparatus, the manufacturing method comprising:
wherein the semiconductor apparatus includes a chip substrate that comprises a circuit and an electrode terminal configured to at least receive supply of one of an electrical signal or power supplied from outside or the electrode terminal is configured to supply one of an electrical signal or power to be outputted to the outside, the electrode terminal is provided on a side face of the chip substrate and an electrode pad provided respectively at an end portion of both a front face and a rear face of the chip substrate, at a position corresponding to the electrode terminal provided on the side face of the chip substrate;
a first step of forming a through-hole on the side face of the chip substrate, at a position on a wafer on which the electrode terminal is formed;
a second step of applying metal forming the electrode terminal to the through-hole; and
a third step of cutting out the chip substrate by cutting the wafer along the through-hole.

6. A manufacturing method of a solid state imaging device, the manufacturing method comprising:
wherein the solid state imaging device includes a chip substrate that comprises a circuit and an electrode terminal configured to at least receive supply of one of an electrical signal or power supplied from outside or the electrode terminal is configured to supply one of an electrical signal or power to be outputted to the outside, the electrode terminal is provided on a side face of the chip substrate and an electrode pad provided respectively at an end portion of both a front face and a rear face of the chip substrate, at a position corresponding to the electrode terminal provided on the side face of the chip substrate;
a first step of forming a through-hole on the side face of the chip substrate, at a position on a wafer on which the electrode terminal is formed;
a second step of applying metal forming the electrode terminal to the through-hole; and
a third step of cutting out the chip substrate by cutting the wafer along the through-hole.

7. A manufacturing method of an imaging apparatus, the manufacturing method comprising:
wherein the imaging apparatus includes a chip substrate that comprises a circuit of an imaging device and an electrode terminal configured to at least receive supply of one of an electrical signal or power supplied from outside or the electrode terminal is configured to supply one of an electrical signal or power to be outputted to the outside, the electrode terminal is provided on a side face of the chip substrate and an electrode pad provided respectively at an end portion of both a front face and a rear face of the chip substrate, at a position corresponding to the electrode terminal provided on the side face of the chip substrate;
a first step of forming a through-hole on the side face of the chip substrate, at a position on a wafer on which the electrode terminal is formed;
a second step of applying metal forming the electrode terminal to the through-hole; and
a third step of cutting out the chip substrate by cutting the wafer along the through-hole.

8. A manufacturing method of an electronic equipment, the manufacturing method comprising:
wherein the electronic equipment includes a chip substrate that comprises a circuit of an imaging device and an electrode terminal configured to at least receive supply of one of an electrical signal or power supplied from outside or the electrode terminal is configured to supply one of an electrical signal or power to be outputted to the outside, the electrode terminal is provided on a side face of the chip substrate and an electrode pad is provided respectively at an end portion of both a front face and a rear face of the chip substrate, at a position corresponding to the electrode terminal provided on the side face of the chip substrate;
a first step of forming a through-hole on the side face of the chip substrate, at a position on a wafer on which the electrode terminal is formed;
a second step of applying metal forming the electrode terminal to the through-hole; and
a third step of cutting out the chip substrate by cutting the wafer along the through-hole.

9. The semiconductor apparatus according to claim 1, wherein the chip substrate is provided on a substrate.

10. The semiconductor apparatus according to claim 9, further comprising:
a second electrode pad provided on the substrate, and the second electrode pad is connected to the electrode terminal through a wiring.

* * * * *